United States Patent
Bowen

(10) Patent No.: US 6,705,783 B1
(45) Date of Patent: Mar. 16, 2004

(54) RUGGEDIZED KEYBOARD WITH CURSOR POSITIONING DEVICE

(76) Inventor: James H. Bowen, 13442 Crimson La., Linden, VA (US) 22642

(*) Notice: Subject to any disclaimer, the term of this patent is extended or adjusted under 35 U.S.C. 154(b) by 0 days.

(21) Appl. No.: 10/269,039

(22) Filed: Oct. 11, 2002

(51) Int. Cl.⁷ .............................. B41J 5/08; B41J 29/12; H03K 17/94
(52) U.S. Cl. ..................... 400/472; 400/477; 400/490; 400/496; 400/473; 341/22; 341/31; 341/25; 341/176
(58) Field of Search ................................ 400/472, 477, 400/490, 496, 473; 341/22, 176, 31, 25; 200/302.1; 178/17 C

(56) References Cited

U.S. PATENT DOCUMENTS

| | | | |
|---|---|---|---|
| 3,526,775 A | 9/1970 | Friedrich et al. | 250/221 |
| 3,603,982 A | 9/1971 | Patti | 341/31 |
| 3,761,919 A | 9/1973 | Baumann | 341/31 |
| 4,417,824 A | 11/1983 | Paterson et al. | 400/477 |
| 4,534,668 A | 8/1985 | Hildel et al. | 400/477 |
| 5,172,805 A | 12/1992 | Gumb | 200/341 |
| 5,491,478 A | 2/1996 | de la Luz et al. | 341/22 |
| 5,642,950 A | 7/1997 | Hochgesang et al. | 400/490 |
| 5,674,018 A | 10/1997 | Kaufman et al. | 400/473 |
| 5,681,122 A | 10/1997 | Burke | 400/472 |
| 5,697,718 A | 12/1997 | Erler et al. | 400/714 |
| 5,810,491 A | 9/1998 | Müller et al. | 400/496 |
| 6,056,457 A | 5/2000 | Chao | 400/472 |
| 6,215,420 B1 | 4/2001 | Harrison et al. | 341/22 |
| 6,273,623 B1 | 8/2001 | Chao | 400/472 |

Primary Examiner—Stephen R. Funk
Assistant Examiner—Wasseem H. Hamdan
(74) Attorney, Agent, or Firm—Whitham, Curtis & Christofferson, P.C.

(57) ABSTRACT

A rugged keyboard and cursor positioning device with an inherent restiveness from external fluids to interior keyboard fluid contamination. The key interrupters and cursor positioning device block optical beams for key and cursor positioning detection thus eliminating contacts and contact actuation life. When a key is in the most depressed position the key cap is against the keyboard top surface protecting all internal parts from pressure, or force from harsh use or a vandals blow.

23 Claims, 17 Drawing Sheets

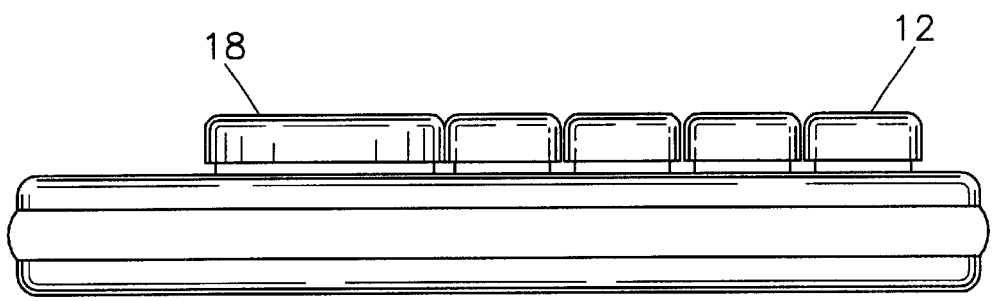
FIG. 4
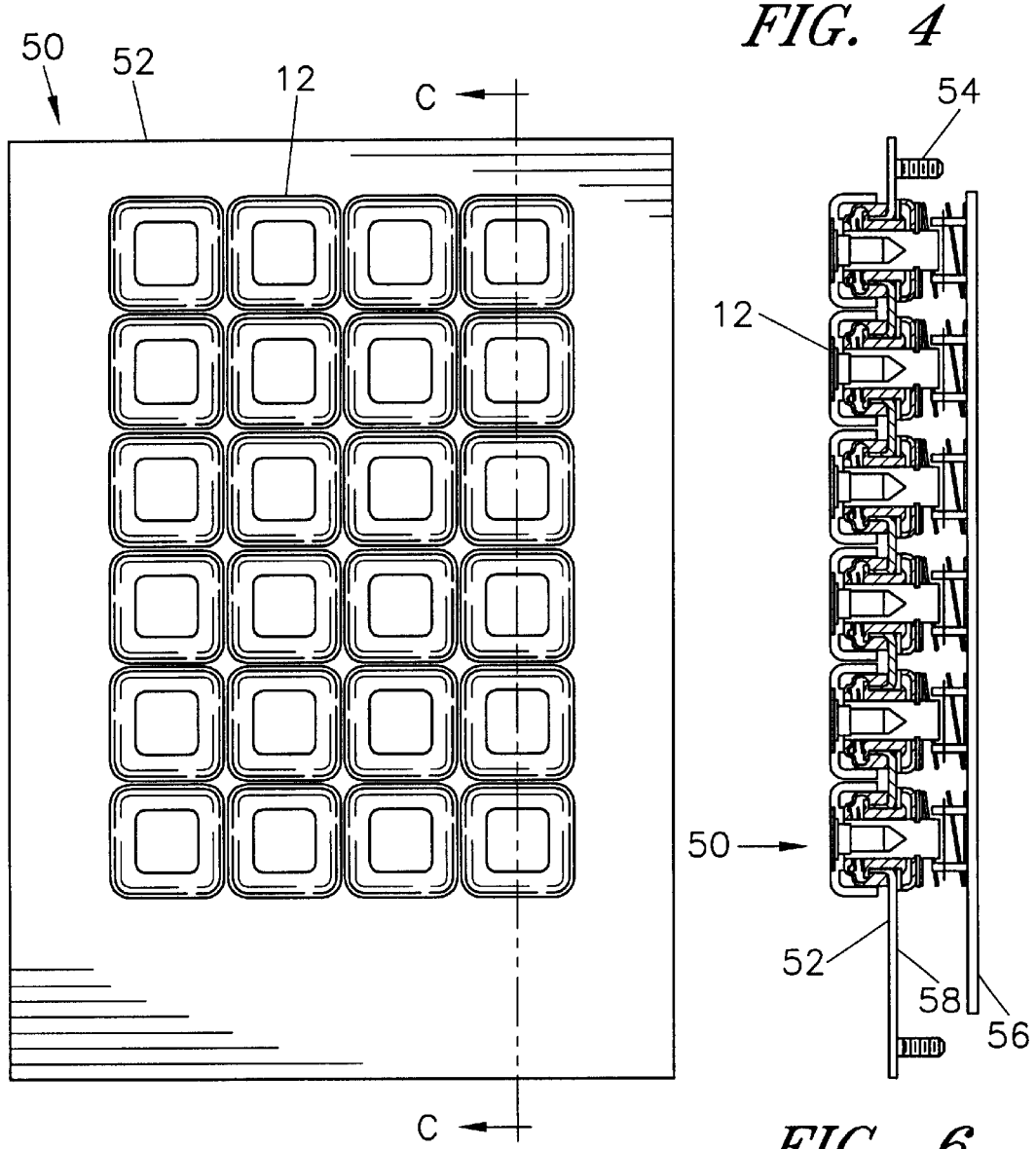
FIG. 5
FIG. 6

RUGGEDIZED KEYBOARD WITH CURSOR POSITIONING DEVICE

BACKGROUND OF THE INVENTION

1. Field of the Invention

The present invention generally relates to keyboards for computers and other devices that need data entry in harsh environments, both indoor and outdoor, and in public access areas.

2. Description of the Prior Art

Prior art keyboards have a moat either around the keys or surrounding the keys. As with a moat when fluid is introduced it is held by the depth of the moat and then must evaporate. If the fluid is water then the residue left after the evaporation process is minimal, but if it is coffee or other fluid that contains sugar or solids, after the evaporation process the solids remain in some gummy or sticky dirt attracting form. One such moat is disclosed in U.S. Pat. No. 6,215,420, a second in FIG. 1 of U.S. Pat. No. 6,056,457 whereas the key caps are shown recessed in the top of the keyboard.

Some prior art keyboards try to minimize the size of the moat by putting a barrier between the keys and various distances up to being coplanar with the top of the key cap. In doing so an operator of the keyboard is hindered by the barrier because if they slightly miss the key when trying to depress the key they hit the barrier thus giving an unnatural typing experience.

Some prior art add a thin flexible elastomer sealing membrane in the moat between the key cap and some part of the keyboard, but these membranes can easily be cut by vandals, by harsh use, or crack when aged, an example is disclosed in U.S. Pat. No. 5,642,950.

Another sealed keyboard as disclosed in U.S. Pat. No. 6,215,420 fabricates the top surface of the keyboard from an elastomer that can be cut by vandals to remove the key caps. When a sealing membrane or elastomer is cut or fails from age there is no inherent design means to stop fluids from getting to the interior of the keyboard.

Some prior art keyboards being used in public access areas have removable key caps that can be removed by vandals from the exterior of the keyboard. These keyboards are meant to be used in office type environments whereas the ease of manufacturing by which the key caps are assembled last out weighs the removability of the key cap by a vandal.

Other sealed keyboards have membrane switches. Membrane being one that by touching a key area the top surface of the keyboard deflects to connect a conductive member to conductive tracks on a printed circuit board. The main drawbacks of these devices are the pressure to make the contact is high, the stroke is short and the life expectancy is low. All sealed prior art uses some type of switches with contacts that have a finite contact actuation life.

Some prior art as disclosed in U.S. Pat. No. 4,417,824 use an interrupter in optical beams to detect a key actuation, and further discloses in FIG. 2 that in the depressed key position the force of furthest depression is stopped by parts of the key mechanism.

SUMMARY OF THE INVENTION

It is therefor the primary objective of this invention to dispose a plurality of islands on a top surface of the keyboard and place a key position in each island. As with an island when fluid is introduced it is only held in depth by surface tension and the viscosity of the fluid. The top surface of this keyboard is a planar or descending surface from the base of the island to at least one, or part thereof, side of the keyboard periphery. These islands and a key cap with the section of an umbrella, even without seals, or if a physical seal fails, give the invention an inherent resistiveness from external fluids to interior keyboard fluid contamination.

Briefly, this invention contemplates having a top surface, key caps, key interrupters, and cursor positioning device with a means allowing fabrication from stainless steel or less expensive materials. The key interrupters block optical beams for key detection thus eliminating contacts and contact actuation life. The cursor positioning device being a downwardly floating circular interrupter disposed between and concentric with the center of an inner and outer circular ring of optical emitters and detectors, whereas depending on the amount of downward movement and the position of downward movement by the circular interrupter emission is blocked, or partially blocked, between a particular pair of emitters and detectors that point the direction of cursor movement.

It is a further object of this invention to have stainless steel key caps that are only removable by releasing the key stem from within the keyboard.

It is a further object of this invention to have a seal protected by the key cap whereas only the thick non-flexing portion of the seal is exposed to a user.

It is also a further object of this invention to have optical switches whereas in the most depressed position require no physical contact with any of the switch surfaces.

It is also a further object of this invention that when a key is in the most depressed position the key cap is against the keyboard top surface protecting all internal parts from pressure, or force from harsh use or a vandals blow.

It is also a further object of this invention to allow the keyboard to be easily cleaned.

It is also a further object of this invention is to have a cursor control device that conforms to all aforementioned keyboard objectives. In operation the operator places their fingers on the device and rocks the articulator in the direction they want the cursor to move to position the cursor. And by taping signatures do single and double taps to input single and doubles clicks to the host computer.

It is also a further object of this invention to alternatively have a top surface, key caps, key interrupters, and cursor control device fabricated from plastic.

And it is also a further object of this invention to alternatively have a planar top surface with fasteners stepped in from the periphery to facilitate attaching the keyboard to a mounting surface.

BRIEF DESCRIPTION OF THE DRAWINGS

The foregoing and other objects, aspects and advantages will be better understood from the following detailed description of the invention with reference to the drawings, in which:

FIG. 4 is a right side view of the keyboard in FIG. 1 in accordance with the teachings of this invention;

FIG. 5 is a plan view of a 24 key position planar keyboard in accordance with the teachings of this invention;

FIG. 6 is a section view through the keyboard in FIG. 5 in accordance with the teachings of this invention;

DETAILED DESCRIPTION OF THE INVENTION

Figure 1:
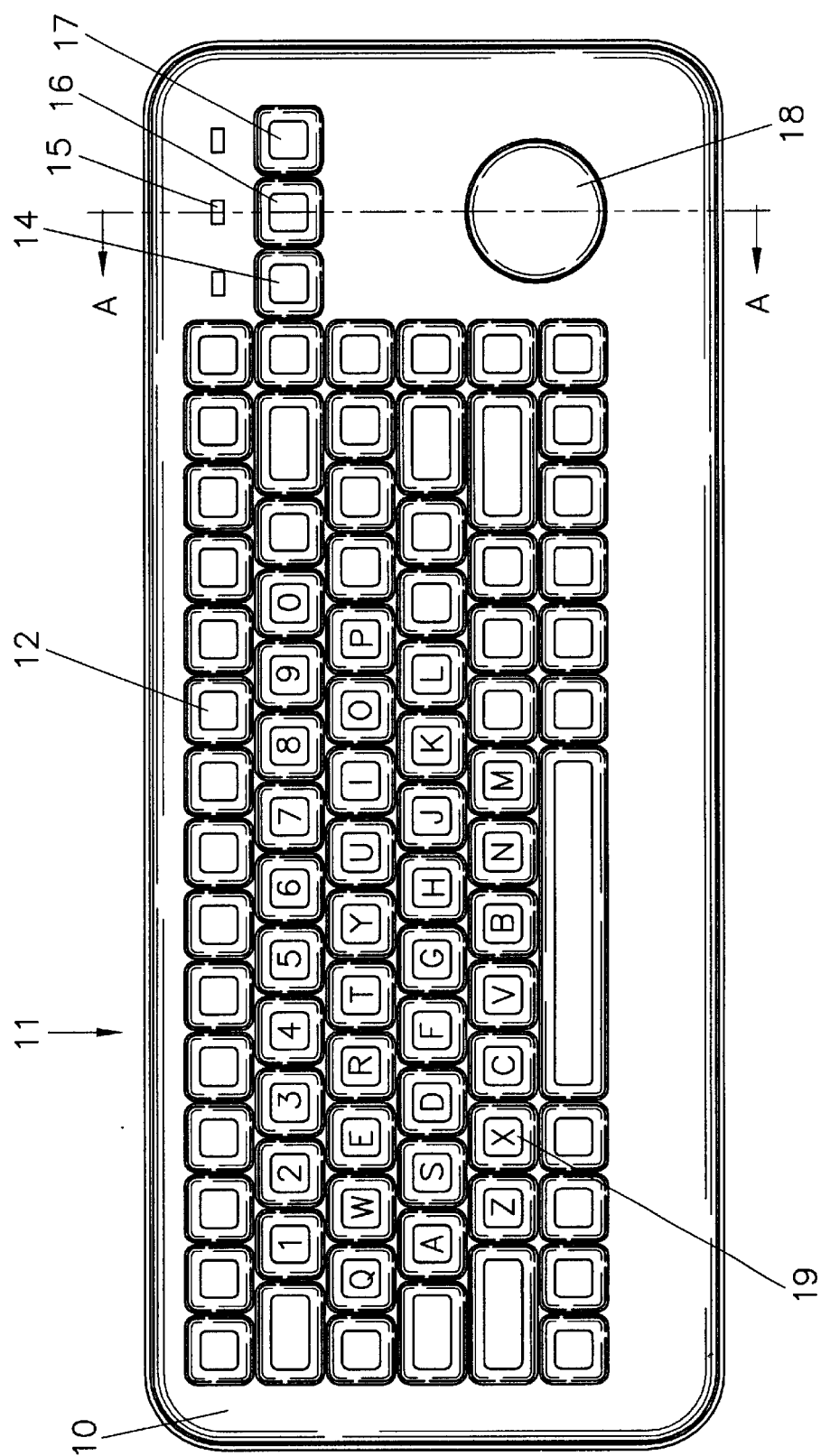
FIG. 1 is a plan view of a 85 key position keyboard and cursor control device in accordance with the teachings of this invention.

Referring now to the drawings, in which the same reference numeral indicates the same element in the various figures, FIG. 1 shows a top surface 10 of keyboard 11 with an array of keys 12 disposed thereon. Indicator lens 15 can indicate when Caps Lock is activated, and other like indicators can indicate when Scroll Lock or Number Lock are activated, but in special custom configurations the indicators can indicate other functions, like keyboard ON, or an operation in progress in the host computer that the operator may want indication. In computer environments where a mouse type device can control some computer functions left button 14 can be used for left clicks and right button 17 can be used for right clicks. In computer environments where a mouse type device can position a cursor, cursor articulator 18 is used to position the cursor. Center button 16 can be used for sensitivity of cursor movement whereby downward movement of cursor articulator 18 verses linear movement of the cursor on a display device can be adjusted. Center button 16 could also be programmed to input the scrolling feature like the wheel on a standard type mouse. Because of customized keyboards indicia 19 can be in a pattern as shown or in other patterns for foreign languages, or when used for machine control the indicia can depict a name or function.

Figures 2, 3:
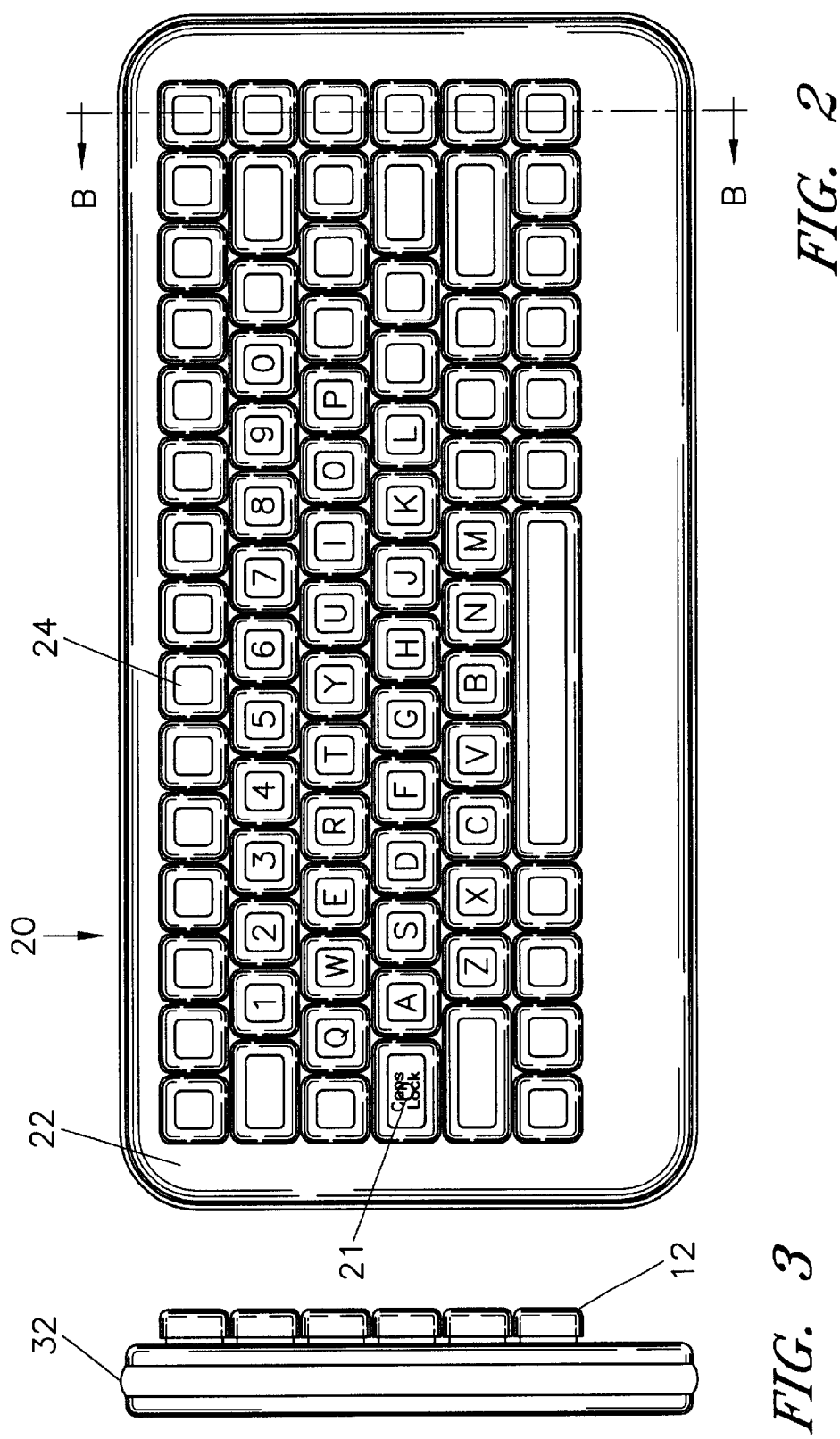
FIG. 2 is a plan view of a 85 key position keyboard in accordance with the teachings of this invention.
FIG. 3 is a left side view of the keyboard in FIG. 2 in accordance with the teachings of this invention.

The keyboard in FIG. 2 showing a keyboard 20 without a cursor controlling device has a top surface 22 and keys 12 disposed thereon. The keyboard left view FIG. 3 of FIG. 2 shows peripheral seal 32 and side view of key 12.

The keyboard right view FIG. 4 of FIG. 1 shows a side view of cursor articulator 18 and key 12.

FIG. 5 shows a keyboard 50 with a planar top surface 52 and key 12. FIG. 6 showing the C—C section view through FIG. 5 with planar top surface 53 with key 12 and mounting studs 54 (downwardly projecting fasteners). Keyboard 50 in FIGS. 5 and 6 are to be mounted to a desk, machine or other structure with mount studs 54 disposed inwardly around the periphery of rear planar surface 58. Printed wiring board 56 mounts and connects the electronic components of keyboard 50.

Figure 11:
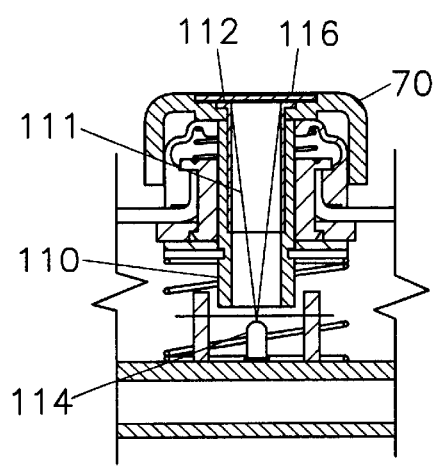
FIG. 11 is a cross section through an alternate key structure in accordance with the teachings of this invention.
Figure 12:
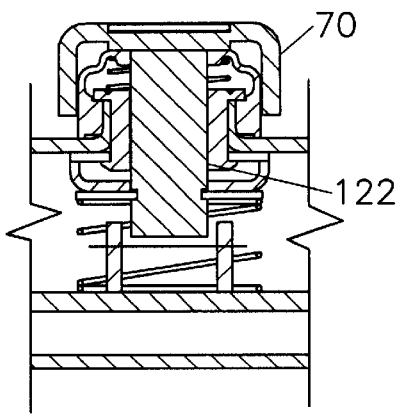
FIG. 12 is a cross section through an alternate key structure in accordance with the teachings of this invention.
Figure 13:
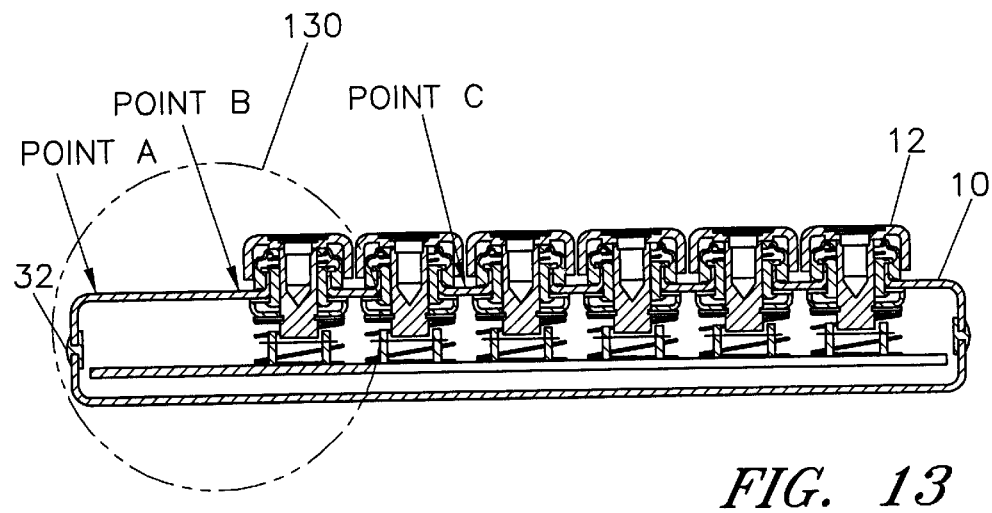
FIG. 13 is a section view through the keyboard in FIG. 2 in accordance with the teachings of this invention.

FIG. 7 through FIG. 12 shows a single key of the cross section of FIG. 13, and some alternative key structures. It should be appreciated that those skilled in the art could substitute any one of these key structures in any of the key positions of the keyboards shown in this invention.

Figure 7:
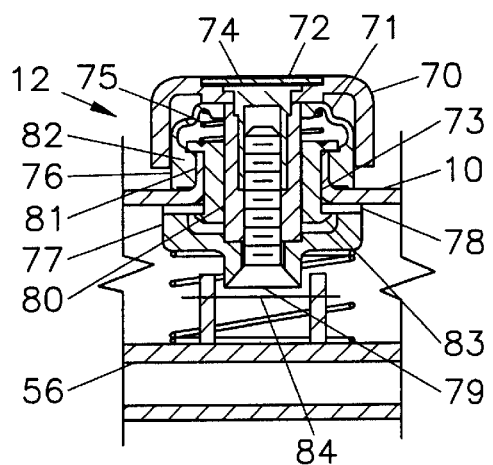
FIG. 7 is a cross section through a typical key structure in a non-depressed position in accordance with the teachings of this invention.

Key indicia 72 in FIG. 7 can be press fit or adhesively attached in key cap 70 of key 12 over press-in threaded insert 74. Key indicia 72 can be printed on adhesive coated plastic or embossed in or printed on metal. These options allow key indicia 72 to be in color or have custom text so they can be installed after the keyboards have been assembled.

Key stem 80 is press fit over threaded insert 74 and is slideably received in bushing 73. Key stem 80 is pressed through upper flex part 71 of physical elastomer key seal 82 forming an upper seal to stop liquids from entering the interior of the keyboard. Lower thick part 76 of a physical elastomer seal 82 is pressed over extruded island 81 forming a lower seal to stop liquids from entering the interior of the keyboard. Lower thick part 76 is the only part of the seal that is exposed to users, so even if lower thick part 76 is completely cut through, bushing 73 will hold lower thick part 76 in place so the seal to the inside of the keyboard will not be broken. Upper flex part 71 is protected by key cap 70 so the user cannot cut or damage it. Bushing 73 is slideably received in extruded island 81 and is held in place by snaps 83 over washer 78. Once snaps 83 engage over washer 78 bushing 73 retains key seal 82 in a contact position with keyboard top surface 10. Although elastomer key seal 82 is a physical seal, even when removed the inherent seal in the design of the extruded island gives the keyboard a means of sealing the interior of the keyboard.

Key retainer 77 is slideably received over key stem 80 and secures keys 12 by fastener 79. By retaining key 12 in this manner, the only way to remove key 12 is by from within the keyboard. Optical beam 84 is blocked by key retainer 77 when key 12 is in the depressed position.

Upper spring 75 returns key 12 to a non-depressed position and maintains a bias pressure on upper flex part 71 of elastomer key seal 82. Each time a key is pressed upper flex part 71 is also forced up to the under side of key cap 70 to assure position is maintain during the life of the keyboard.

Figure 8:
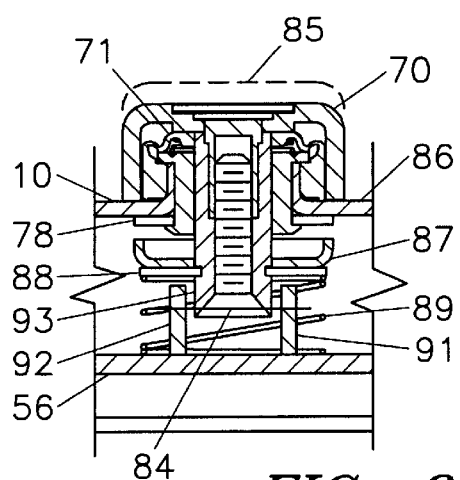
FIG. 8 is a cross section through a typical key structure in the depressed position in accordance with the teachings of this invention.

Dotted line 85 in FIG. 8 shows the non-depressed location of key cap 70 that is shown in the depressed position compressing upper flex seal part 71 and upper spring 75. As seen at contact point 86 key cap 70 and top surface 10 are the only parts that touch when key cap 70 is fully depressed. So any force be it harsh use or a vandals blow can not damage interior parts. Cup retainer 87 is an alternative retaining means to key retainer 77. When cup retainer is used snap retainer 88 snaps over stem interrupter 93 to secure key 12. In some harsh environments more key pressure is desired so lower key spring 89 can be used.

Emitter 91 emits a beam 84 to detector 92, and as shown in FIG. 8, when stem interrupter 93 is in the depressed position beam 84 is blocked being detected by the electronics as a key has been pressed.

Figure 9:
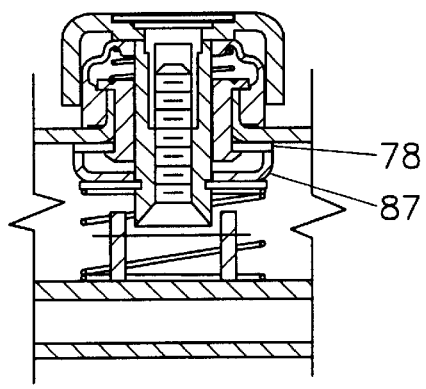
FIG. 9 is a cross section through an alternate key structure in accordance with the teachings of this invention.

Cup retainer 87 in FIG. 9 is shown in contact with washer 78 when key 12 is in the non-depressed position restricting upward movement.

Figure 10:
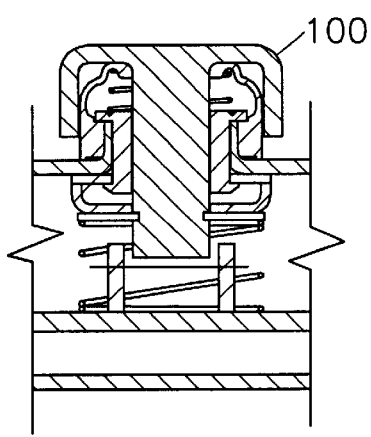
FIG. 10 is a cross section through an alternate key structure in accordance with the teachings of this invention.

FIGS. 10 through 12 show more alternative means to fabricate key 12 and associated parts. Formed key cap 100 in FIG. 10 shows that the part can be made in an impact extruded process, a hot forged process, or molded in a one piece process. Using this means the indicia can be stamped or etched directly into the top of key cap 70. Pressed on hollow stem interrupter 110 shown in FIG. 11 is pressed over hollow press-in insert 112 that has been pressed into key cap 70. LED beam 111 is emitted from key stem LED 114 to illuminate through translucent indicia lens 116 showing an input has been made to the host computer, or that the host computer has input data to the keyboard, as with the bi-directional data between the host computer and the keyboard when the caps lock key has been pressed. Weld-on stem interrupter 122 is shown in FIG. 12 welded directly to key cap 70, with this alternative means of fabrication key indicia can be pressed or etched directly into the top key cap 70.

Figure 13A:
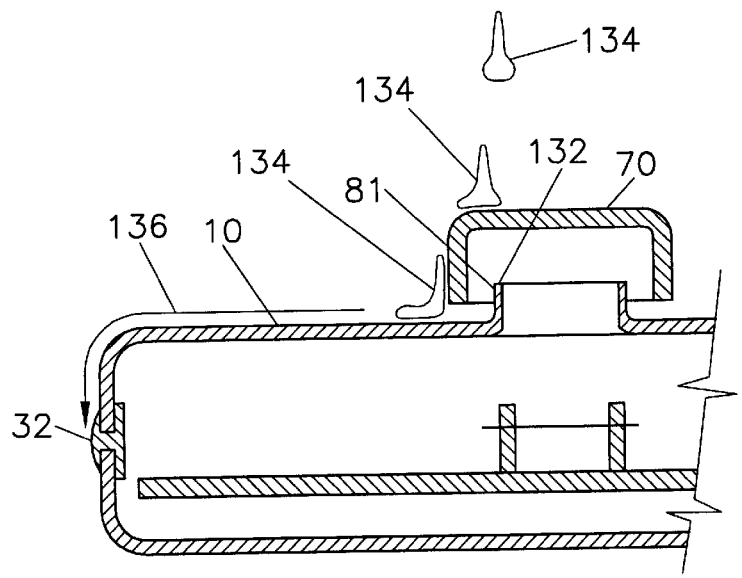
FIG. 13A is an enlarged detail view of FIG. 13 showing the umbrella and island cross section of the keyboard in accordance with the teachings of this invention.

FIG. 13 shows the cross section at B—B of FIG. 2 showing a Point A at the periphery of top surface 10, a Point B at the base of a typical island, and a Point C between any two typical islands, all showing that all points are below island top surface 132 in FIG. 13A, showing that all fluids on top surface 10 will drain off the keyboard rather than contaminating the interior of the keyboard. FIG. 13A is an enlargement of detail 130 of FIG. 13 with some of the internal parts removed for clarity illustrating the umbrella shape of key 12 covering the extruded island 81 rising from and above top surface 10. Extruded island 81 having an island top surface 132. Showing fluid drops 134 being poured on key cap 70, showing even without seals, if a liquid is poured on top of key cap 70 it will follow path 136 and flow away from extruded island 81, and not up and over island top surface 132, across the keyboards planar or descending surface to at least one, or part thereof, side of the keyboard periphery, and over peripheral seal 32 giving by design an inherent resistiveness to internal fluid contamination. This path for contaminating fluids to easily flow off the keyboard also allows for easy cleaning of the keyboard because the cleaners can also flow off the keyboard easily.

Figure 14:
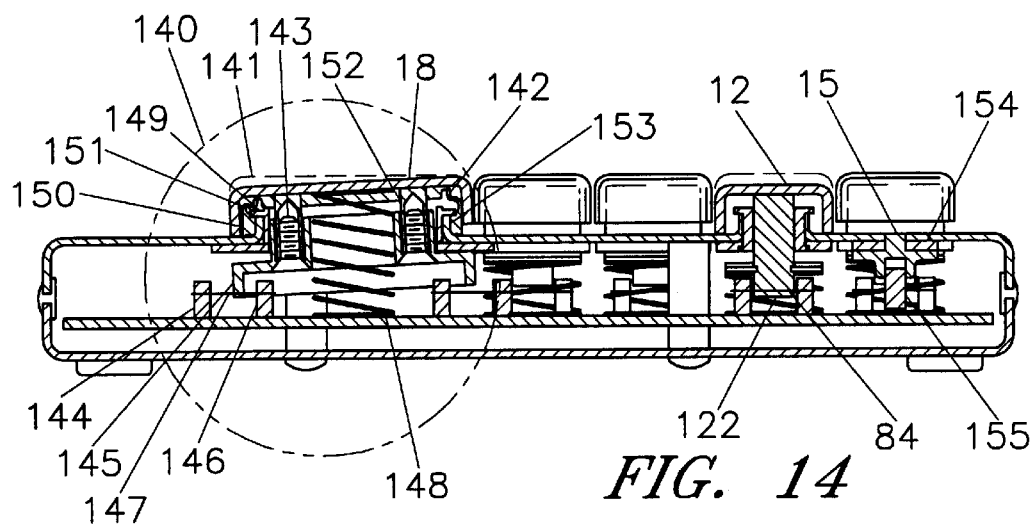
FIG. 14 is a cross section through the keyboard in FIG. 1 showing the circular interrupter in a downward position in accordance with the teachings of this invention.

FIG. 14 shows the cross section at A—A of FIG. 1. Indicator 15 slideably receives indicator emitter 155 and is adhesively held in place by indicator seal 154. Key 12 is shown in a depressed position with weld on stem interrupter 122 blocking beam 84. Detail 140 shows the cursor control device of the keyboard. Cursor articulator 18 is shown in a partially depressed position and is retained by fasteners 143 being threadably received into projections 152 coming from the lower side of cursor articulator 18 holding circular interrupter 145 rigid against projections 152. Projections 152 are pressed through cursor upper flex part 142 of cursor elastomer seal 151 forming an upper seal to stop liquids from entering the interior of the keyboard. Cursor lower thick part 150 of cursor elastomer seal 151 is pressed over cursor extruded island 153 forming a lower seal to stop liquids from entering the interior of the keyboard. Cursor lower thick part 150 is the only part of the seal that is exposed to users, so even if lower thick part 150 is completely cut through, bushing 149 will hold cursor lower thick part 150 in place so the seal to the inside of the keyboard will not be broken. Cursor upper flex part 142 is protected cursor articulator 18 so the user cannot cut or damage it.

Cursor bushing 149 is slideably received in cursor extruded island 153. Circular interrupter 145 is slideably received in cursor bushing 149 with enough clearance to allow angular movement of circular interrupter 145. The periphery of circular interrupter 145 is allowed to float in the downwardly direction only being opposed by mouse spring 148, and when depressed the periphery of circular interrupter 145 can block or partially block the cursor optical beam 147 emitting from emitter 146 and being detected by detector 144.

Figure 14A:
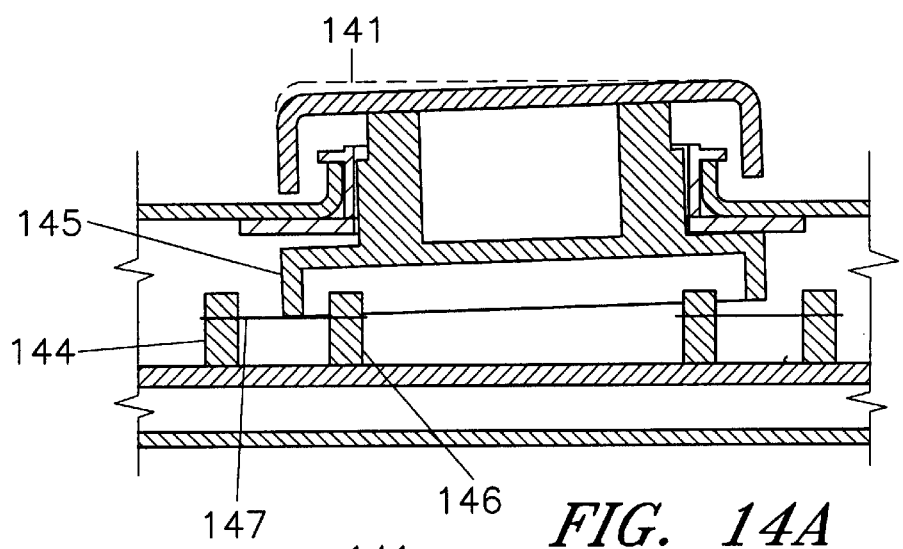
FIG. 14A is a is an enlarged detail view of FIG. 14 with the circular interrupter in an intermediate downward position in accordance with the teachings of this invention.
Figure 14B:
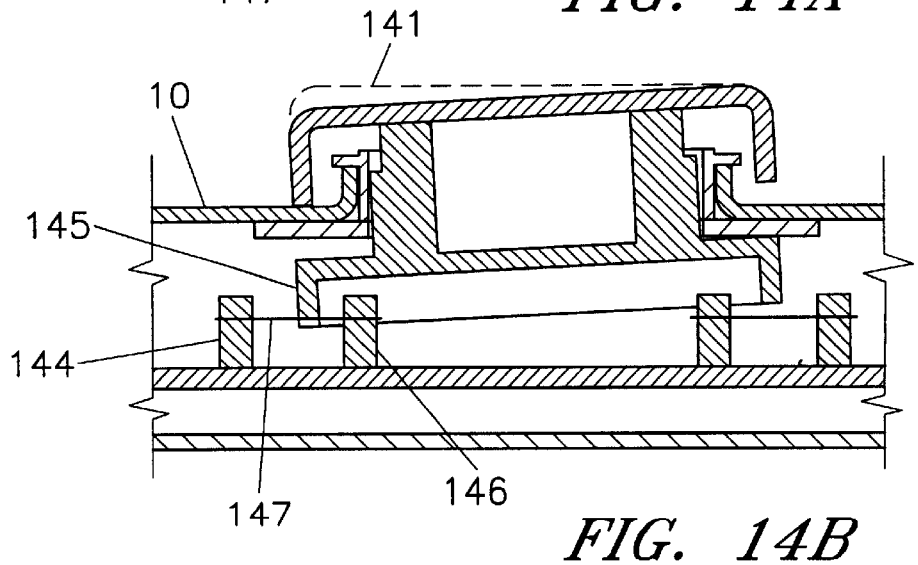
FIG. 14B is a is an enlarged detail view of FIG. 14 with the circular interrupter in a full downward position in accordance with the teachings of this invention.

FIG. 14A is an enlargement of detail 140 of FIG. 14 with some of the internal parts removed for clarity to better show circular interrupter 145 in a partially blocked position. As shown circular interrupter 145 can partially block the cursor optical beam 147 emitting from emitter 146 and being detected by detector 144. FIG. 14B is an enlargement of detail 140 of FIG. 14 with some of the internal parts removed for clarity to better show circular interrupter 145 in a fully blocked position, and to show that in the most downward position that cursor articulator 18 will contact the top surface 10 to stop harsh use or excessive force prior to damage of internal parts. As shown circular interrupter 145 can block the cursor optical beam 147 emitting from emitter 146 and being detected by detector 144.

Figures 15, 15A:
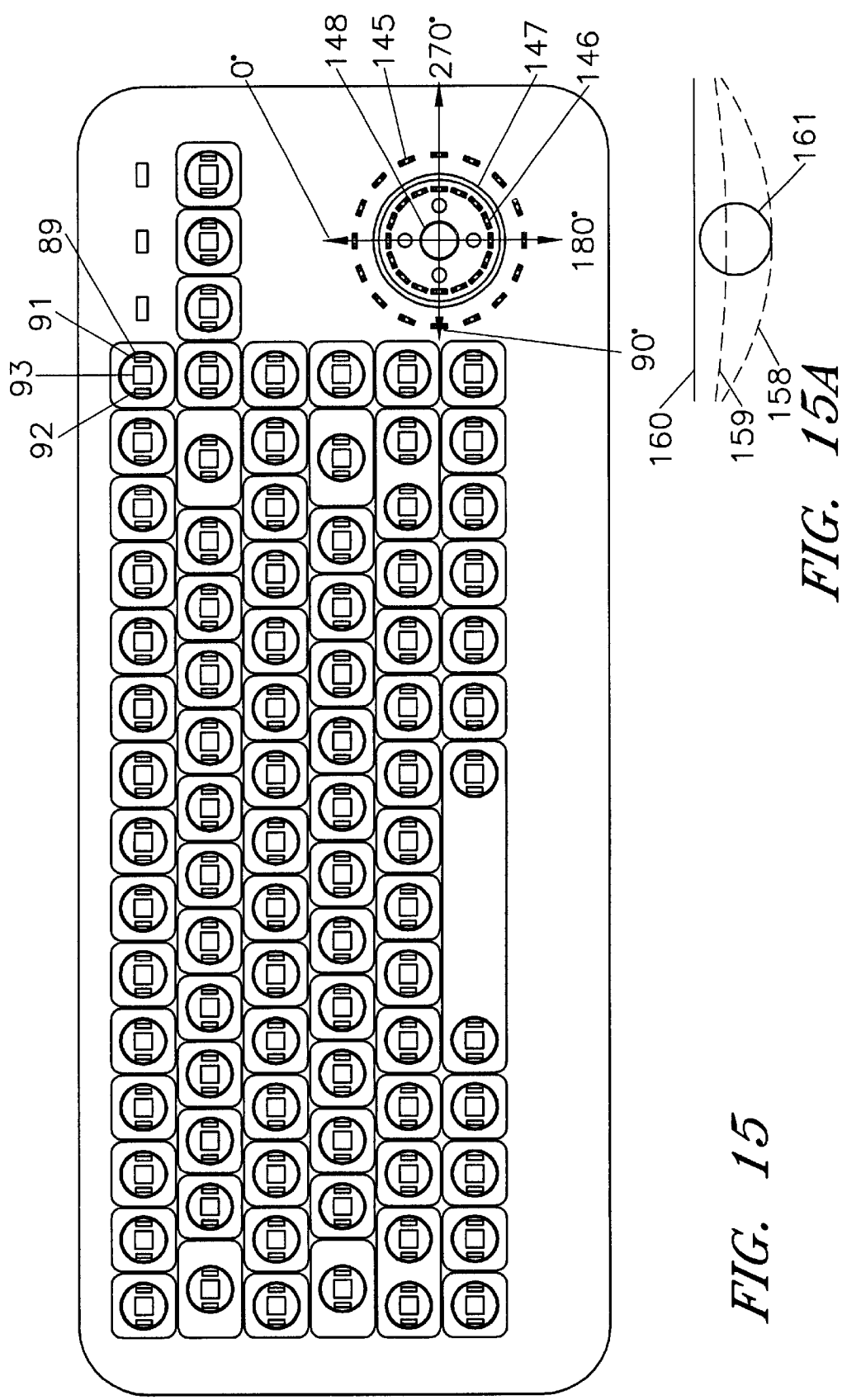
FIG. 15 is a mechanical schematic illustrating the relationship of the emitters and detectors to the key and circular interrupters of the keyboard in accordance with the teachings of this invention.
FIG. 15A is a diagram of the optical beam illustrating the effect of the varying downward movement of the circular interrupter on the optical beam in accordance with the teachings of this invention.

FIG. 15 is a mechanical schematic illustrating the relationship of the emitters and detectors to the key and circular interrupters of the keyboard. Lower key spring 89 is disposed around emitter 91 and detector 92 and stem interrupter 93 disposed between emitter 91 and detector 92. Stem interrupter 93 is shown with a square cross section but it should be appreciated that the cross section could be another polygon or even round. A cross section other than round inherently limits key rotation about the center axis of stem interrupter 93.

The downwardly floating circular interrupter 147 is disposed between and concentric with the center of an inner circular ring of optical emitters 146 and an outer circular ring of detectors 145, whereas depending on the amount of downward movement and the position of downward movement by circle interrupter 147 emission is blocked, or partially blocked, between a particular pair of emitters and detectors that point the direction of cursor movement. It should be appreciated by those skilled in the art that the inner ring could be detectors and the outer ring could be emitters, the number of emitters and detectors could vary and produce a similar result. The numbers of degrees shown about the center of circular interrupter 147 depict the relation to cursor movement. If the cursor is to be moved up the display then pressing circular interrupter 147 at angle zero would direct the cursor in that direction, if pressing at angle 270 the cursor would move to the right on the display. The distance that the cursor moves is related to the distance circular interrupter 147 is depressed.

FIG. 15A is a diagram viewing optical beam 161 through the axis of cursor optical beam 147 as shown in FIG. 14A illustrating the effect of the varying downward movement of circular interrupter 147 on optical beam 161 at various positions of downward movement. Line 160 shows the lower edge of circular interrupter in the non-depressed position. First curved line 159 shows the radius formed when one side of circular interrupter is moved in a downward direction. Second curved line 158 shows the radius gets smaller as circular interrupter 147 is positioned in a further downward position. As seen by line 160 when circular interrupter 147 is in the non-depressed position optical beam 161 between inner ring emitters 146 and outer ring detectors 145 all see a flat line. As soon as circular interrupter 147 is depressed downward the smallest amount a radius is formed and the lowest point of that radius through angle interpolation between the closest emitter detectors point the cursor in the direction of desired cursor movement.

Figure 16:
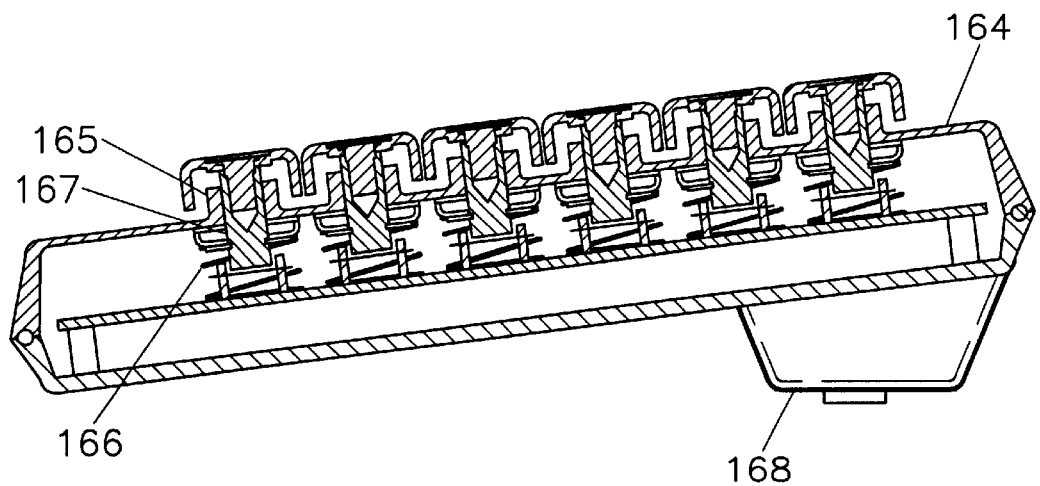
FIG. 16 is a section view of the keyboard when molded and without key interrupter seals in accordance with the teachings of this invention.

Top surface 164 of FIG. 16 is similar to top surface 10 of FIG. 13 in as much as it functions the same except that it is of less expensive molded construction. Molded island 165 is shown and can be molded from a material with high lubricity so no bushing is needed to slideably receive key stem 167. Lower spring 166 can be fabricated with a higher spring force so only one spring is needed per key assembly further reducing cost. In this configuration the only sealing means is the inherent umbrella and island design of the invention. Angle foot 168 is added to elevate the rear of the keyboard to a different angle for typing.

Figure 17:
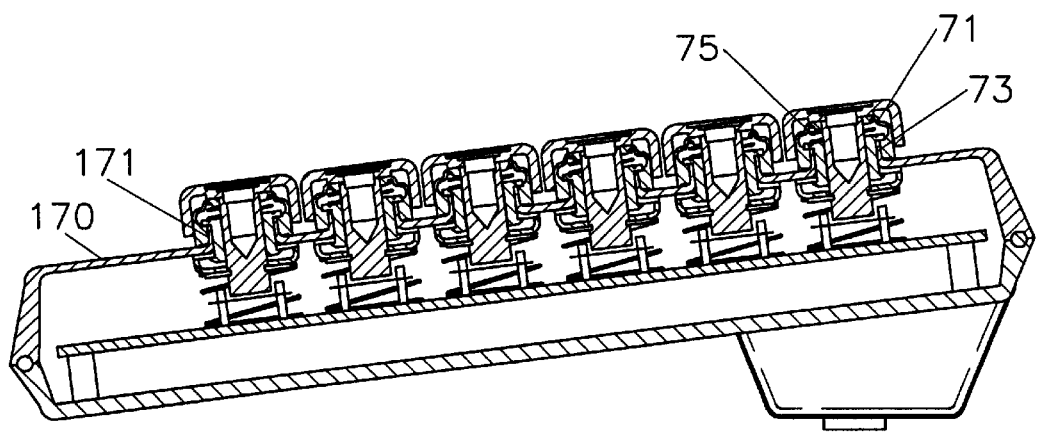
FIG. 17 is a section view of the keyboard when molded with key interrupter seals in accordance with the teachings of this invention.

FIG. 17 shows a molded construction similar to FIG. 16 except it is fully sealed with flex seal 71, bushing 73 and upper spring 75. Top surface 170 is molded with molded island 171 with a larger opening than molded island 165 to receive bushing 73.

Figure 18:
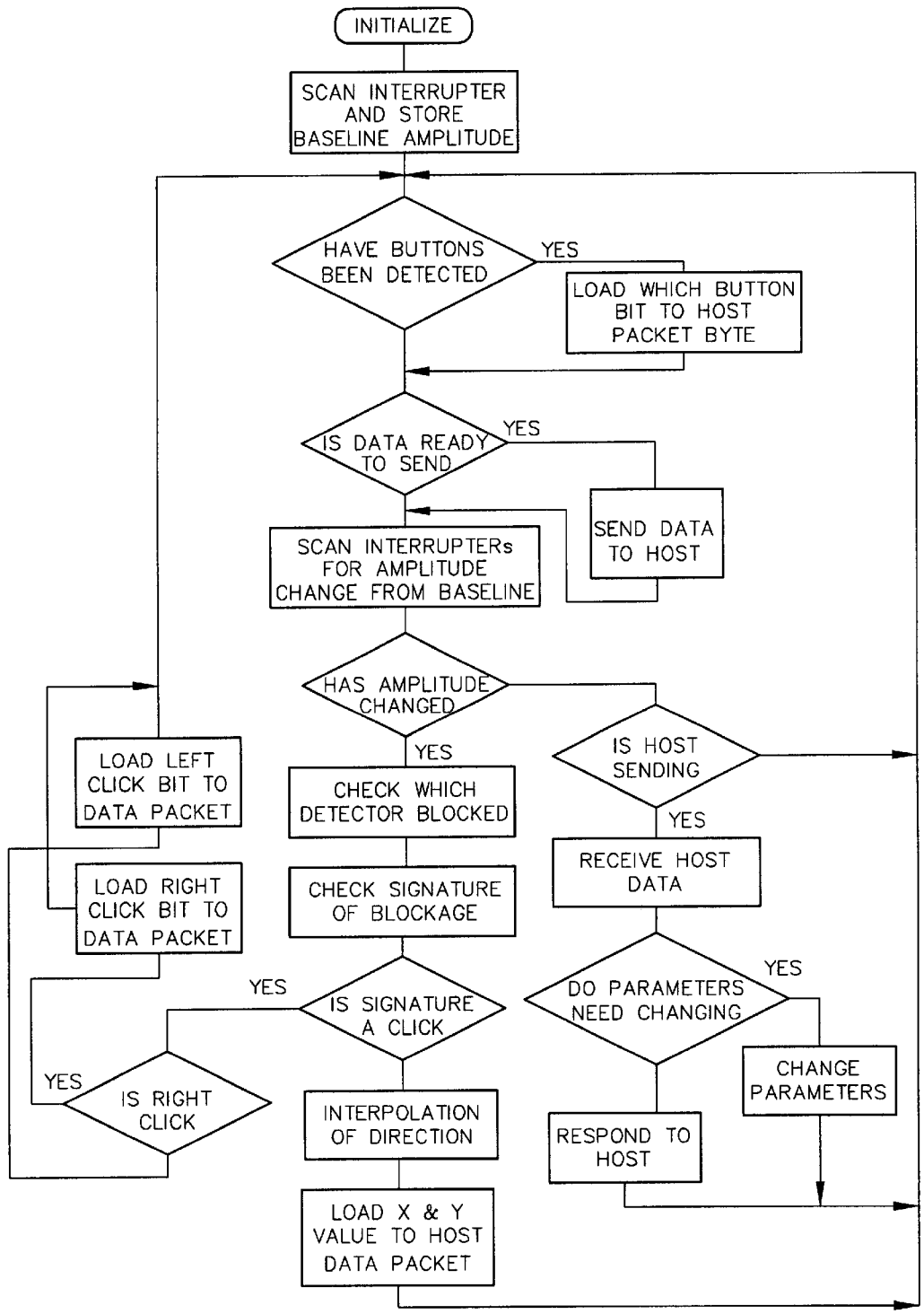
FIG. 18 is a flow diagram illustrating the function of the cursor control device in accordance with the teachings of this invention.
Figure 19:
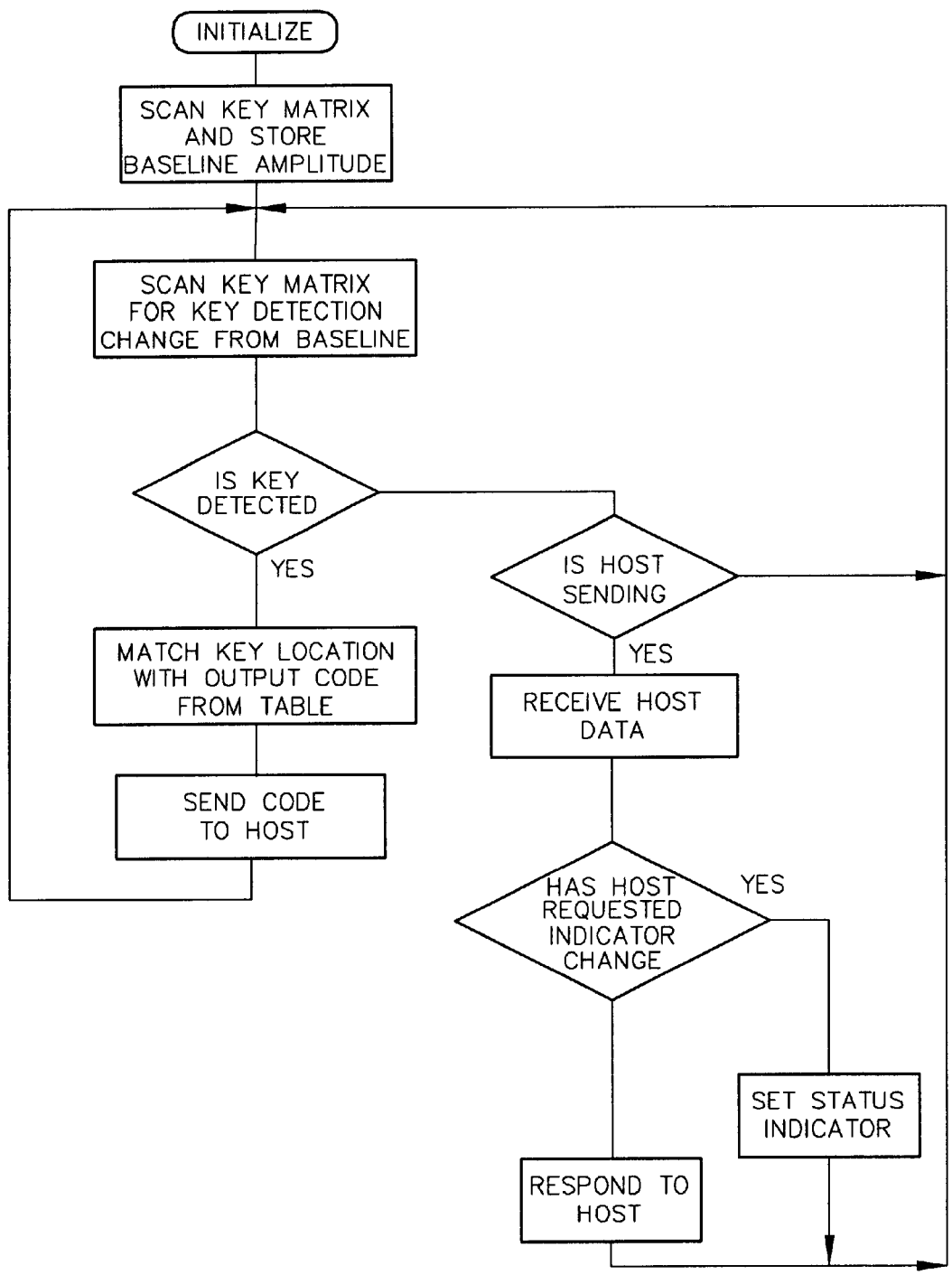
FIG. 19 is a flow diagram illustrating the function of the keyboard in accordance with the teachings of this invention.

FIGS. 18 and 19 are firmware flow charts of the keyboard and mouse. The keyboard and integral mouse are mechanically one structure but both communicate with separate ports to the host. One skilled in the art can appreciate that the flow charts can be combined in practice by choice. FIG. 18 is the flow chart for the mouse, in INITALIZE ports are set to be in either input or output conditions depending on use, ram is tested, and start up sequence with the host is done. Key detection is optical so because emitters and detector vary with age SCAN INTERRUPTER AND STORE BASELINE AMPLITUDE stores a baseline amplitude for the interrupters for buttons 14, 16 and 17, and circular interrupter 145 before the optical beams are blocked. The optical beams are then checked at HAVE BUTTONS BEEN DETECTED for buttons 14, 16 and 17 and compared to the baseline value, if a difference is found at YES the particular button at LOAD WHICH BUTTON BIT TO HOST PACKET BYTE is loaded into a data packet to be sent to the host at an interval time set by the host. If data has been loaded into the data packets IS DATA READY TO SEND tests and sends at SEND DATA TO HOST. SCAN INTERRUPTERs FOR AMPLITUDE CHANGE FROM BASELINE scans the inner and outer rings of emitters and detectors shown in FIG. 15. HAS AMPLITUDE CHANGED tests if the circular interrupter 145 has been depressed, if no change is detected then a test is made at IS HOST SENDING to see if the host is requesting data, if no, then a return is made to retest for interrupter detection. If YES at IS HOST SENDING then the data is received and a test is made if parameters need to be changed at DO PARAMETERS NEED CHANGING, if YES, then CHANGE PARAMETERS and return, if no, RESPOND TO HOST as requested and return.

If YES at HAS AMPLITUDE CHANGED then CHECK WHICH DETECTOR BLOCKED, then CHECK SIGNATURE OF BLOCKAGE. A blockage signature is set by the host and is the timing of the on/off duration of how long a detector is blocked. This duration can be set to match a users response time when clicking or double clicking, if a user wants to single or double click very slow or very fast this duration or combination of duration's give a user a blocking signature. By checking this signature at CHECK SIGNATURE OF BLOCKAGE the logic can tell if a click should be sent to the host or a cursor movement should be sent, this test is made at IS SIGNATURE A CLICK, if YES, then test which button at IS RIGHT CLICK, if not right click it must be a left click, load the bit to the data packet to be sent to the host.

If the signature at IS SIGNATURE A CLICK is not a click then INTERPOLATION OF DIRECTION is made. With the detectors being in a circle a detector or detectors that are blocked point in the direction the circular interrupter is being depressed. A curve is calculated by the difference in amplitude of the blocked detectors. The calculated peak of this curve combined with the location of the blocked detectors gives the direction to move the cursor. A direction ratio to match the direction of X and Y position is loaded into the data packet to be sent to the host at LOAD X & Y VALUE TO HOST DATA PACKET. The amount of cursor movement in distance on the display is a direct relation to how much of the detector is blocked to the movement delta from the previous movement sent to the host. The direction ratio is only to show direction, by adding to the direction ratio the delta from previous movement a speed and distance of movement of the cursor is made. A sensitivity adjustment can be added to vary the amount of movement of the circular interrupter to the distance traveled by the cursor. Example, at one sensitivity setting moving the circular interrupter one millimeter could move the cursor one hundred millimeters, another sensitivity setting could be moving the circular interrupter a half millimeter could move the cursor two hundred millimeters. This sensitivity adjustment modifies the movement delta. It can be a fixed value for some applications or a user variable in other applications.

After the direction ratio, the movement delta, and the sensitivity are calculated the sum is loaded into the data packet at LOAD X & Y VALUE TO HOST DATA PACKET, then a return to test for buttons is made.

FIG. 19 is the flow chart for the keyboard firmware, in INITALIZE ports are set to be in either input or output conditions depending on use, ram is tested, and start up sequence with the host is done. Key detection is optical so because emitters and detector vary with age SCAN KEY MATRIX AND STORE BASELINE AMPLITUDE stores a baseline amplitude for the interrupters before the optical beams are blocked. Once the baseline amplitude has been stored the scanning process is started at SCAN KEY MATRIX FOR KEY DETECTION CHANGE FROM BASELINE where each detector is scanned for the presents of a key interrupter. A test is made at IS KEY DETECED to see if a change has occurred between the baseline and the present detector amplitude, if the change is not enough to be a interrupter blocking the beam then the host is tested to see IS HOST SENDING, if the host is not sending then the program returns to start a new scan. If the host has requested data from the keyboard the keyboard RECEIVES HOST DATA, if the data is to set an indicator then the indicator is set at SET STATUS INDICATOR and a return is made to a new scan. If an indicator change has not been requested by the host then the data is acted on and a return to a new scan is made. If a key has been detected then the detector that is blocked is matched at MATCH KEY LOCATION WITH OUTPUT CODE FROM TABLE and the key code is sent to the host at SEND CODE TO HOST, and then a return is made to start a new scan.

Figure 20:
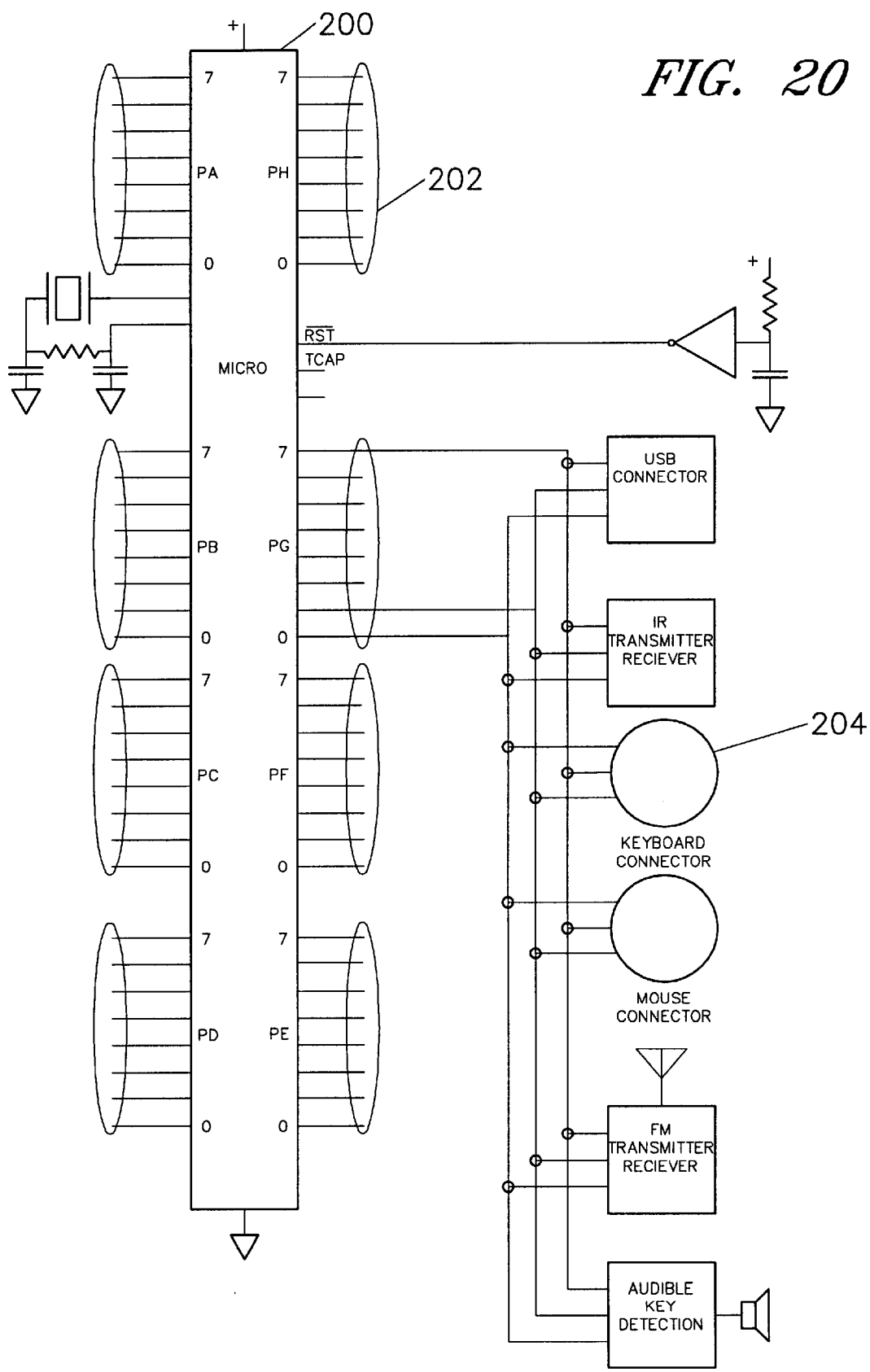
FIG. 20 is a schematic illustrating the microprocessor section of the keyboard in accordance with the teachings of this invention.
Figure 21:
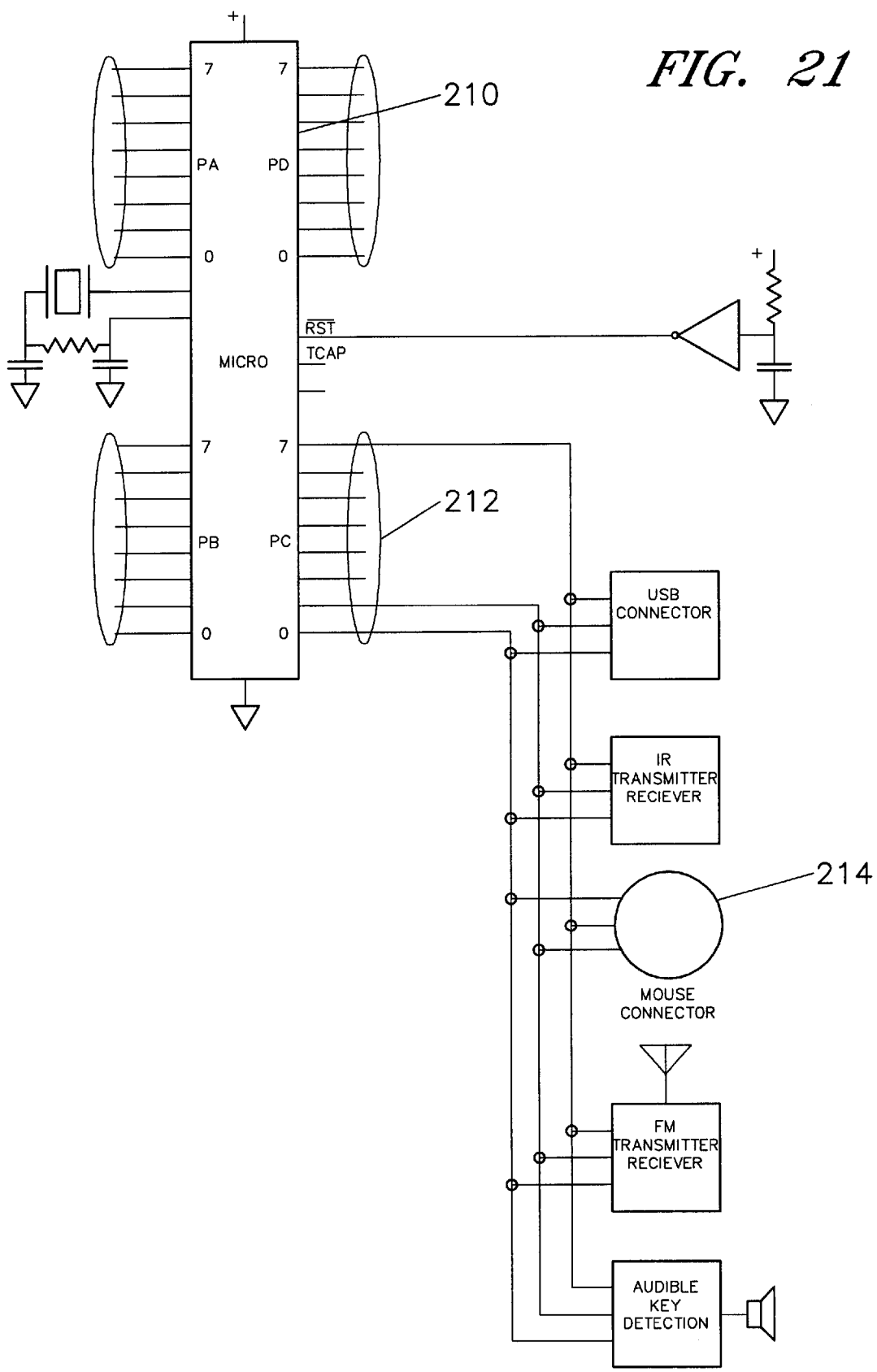
FIG. 21 is a schematic illustrating the microprocessor section of the cursor control device in accordance with the teachings of this invention.

FIGS. 20 and 21 are schematics of the micro processor section of the keyboard and mouse. The keyboard and integral mouse are mechanically one structure but both communicate with separate ports to the host. Ones skilled in the art can appreciate that the schematics can be combined in practice by choice. FIG. 20 is the micro processor schematic for the keyboard. Keyboard micro processor 200 has various ports under control of the firmware, one such port 202 is shown labeled PH referring to Port H, these ports control the input/output of the keyboard, turning on and off the emitters and detectors, and detecting varying voltage amplitudes from 10 the detectors. One such input/output is shown at keyboard connector 204.

FIG. 21 is the micro processor schematic for the mouse. Mouse micro processor 210 has various ports under control of the firmware, one such port 212 is shown labeled PC referring to Port C, these ports control the input/output of the mouse, turning on and off the emitters and detectors, and detecting varying voltage amplitudes from the detectors. One such input/output is shown at mouse connector 214.

Figure 22:
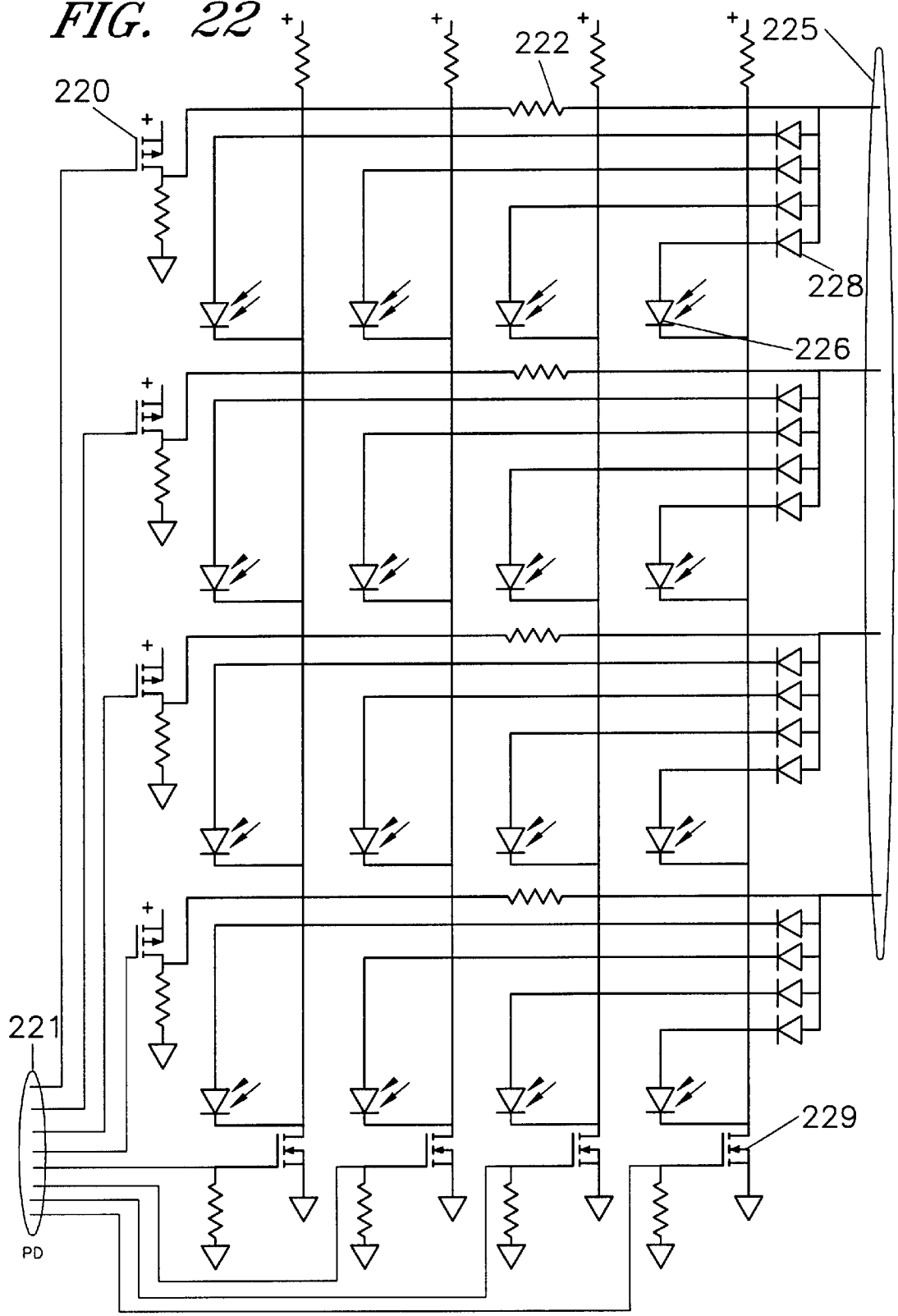
FIG. 22 is a schematic illustrating the elements of a typical detector matrix of the keyboard in accordance with the teachings of this invention.
Figure 23:
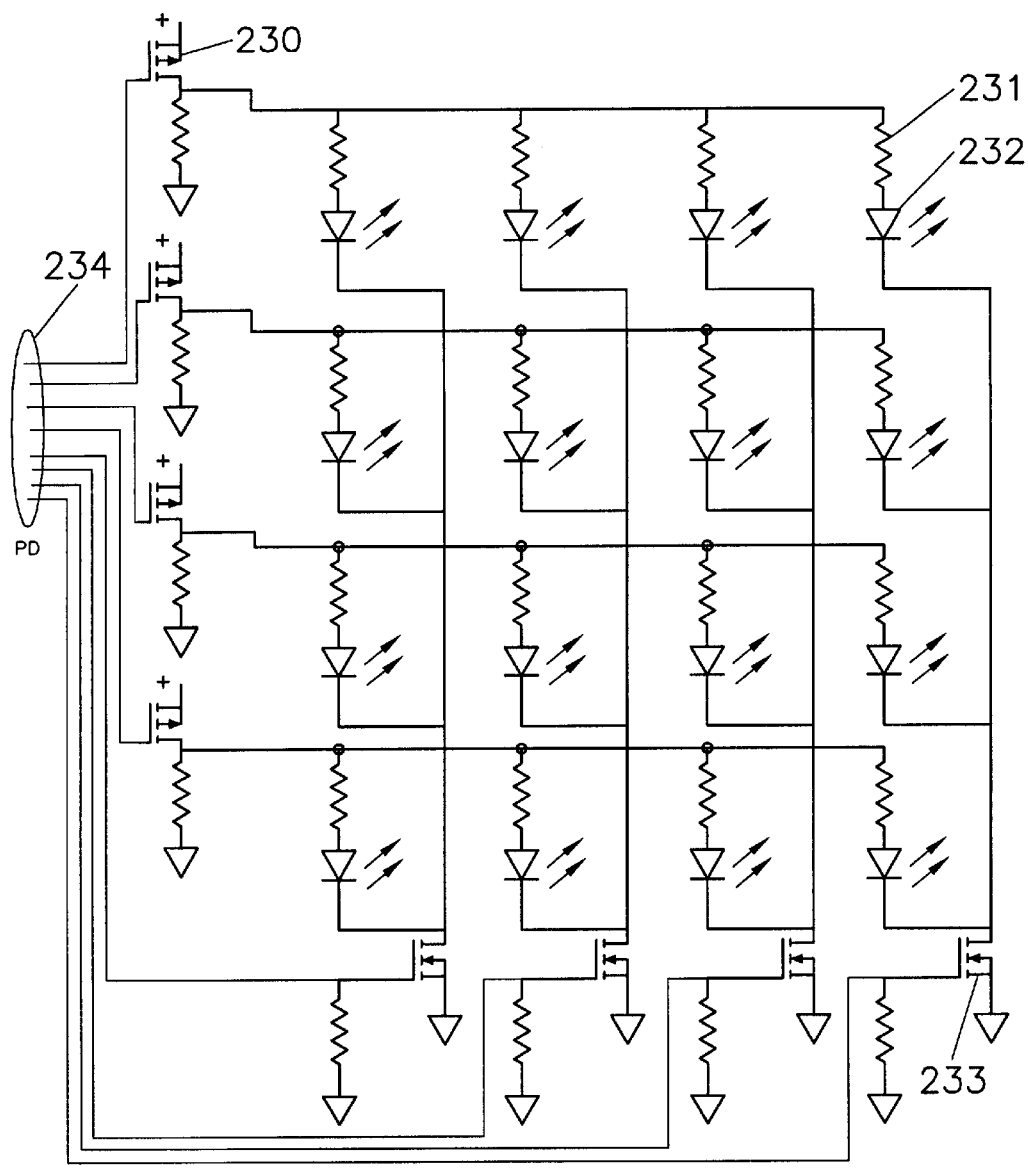
FIG. 23 is a schematic illustrating the elements of a typical emitter matrix of the keyboard in accordance with the teachings of this invention.

The quantities of keys vary with different keyboards for different applications as shown in FIG. 1 and in FIG. 5. FIG. 22 shows a typical detector matrix, and FIG. 23 shows the detectors matching typical emitter matrix, and depending on the number of detectors and emitters needed in a given keyboard these typical matrixes can be increased or increased to match the application. And the same is true for the mouse. If the application need is a very accurate mouse then more detectors can be used so less interpolation is needed, but if the application need is only for X and Y positioning then only four detectors are needed. In operation PFET 220 is turned to give a positive bias to signal resistor 222 by output port 221, at the same time NFET 229 is turned on to give a negative bias to the cathode of detector 226 by port 221. A voltage amplitude is then seen across oring diode 228 and at input port 225. This voltage amplitude will then vary depending on 35 the amount of light that is emitted to detector 226. The amount of light that can be emitted to the detector is governed by the position of the key or mouse interrupter. If the interrupter is not depressed then the majority of the light from an emitter is received by the detector, then depending on the amount of depression by the user on the interrupter varying amounts of light will be seen as voltage amplitude changes at port 225. When the base line amplitude is stored the amplitude is stored when the emitters are not turned on.

In FIG. 23 PFET 230 is turned on by port 234 to give a positive bias to emitter 231 through current limiting resistor 231, NFET 203 is then turned on by port 234 the give a negative bias to emitter 232 thus illuminating emitter 232. Using a matrix like is shown in FIG. 22 and FIG. 23 has two distinct advantages, one being a power saving in overall current drain from the host because the detectors are alternatively turned on, and two, isolating detector emitter pairs to limit cross talk between different detector emitter pairs.

Figure 24:
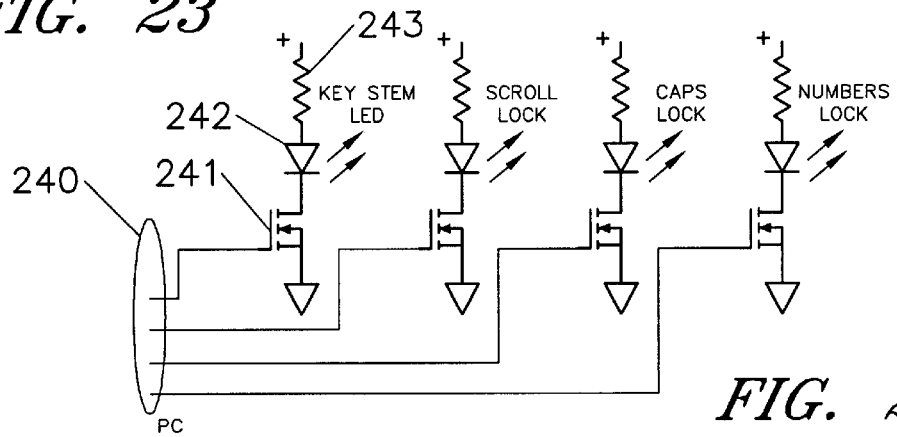
FIG. 24 is a schematic illustrating the elements of indicator control of the keyboard in accordance with the teachings of this invention.

Indicators to show the state of different keyboard functions are shown in FIG. 24 where PFET 241 in turned on by port 240 negatively biasing LED 242 in respect to positive through current limiting resistor 243, thus illuminating LED 242. A single key stem LED is shown but in can be appreciated that every key stem could have a LED depending on the application.

Figure 25:
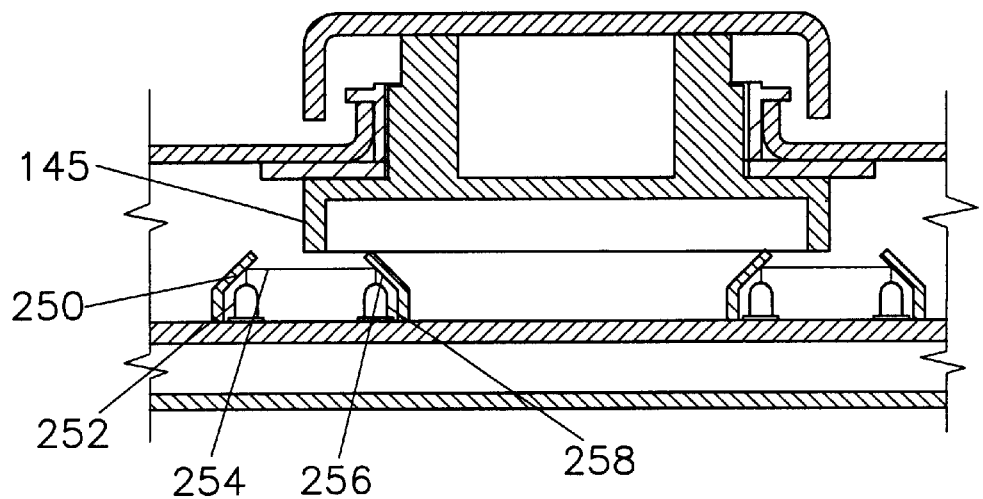
FIG. 25 is an enlarged detail view 140 of FIG. 14 with the circular interrupter in a non-depressed position with an alternative optical design with dual stationary mirrors in accordance with the teachings of this invention.

FIG. 25 is an enlarged detail view of FIG. 14 with the circular interrupter in a non-depressed position showing a light beam 254 being directed from emitter 258 to emitter mirror surface 256 to detector mirror surface 250 to detector 252. The downward movement of circular interrupter 145 will attenuate beam 254 by the amount of downward movement. In this alternate design by increasing the length of beam 254 will increase the divergence of beam 254 and decrease the sensitivity in position of the downward movement.

Figure 26:
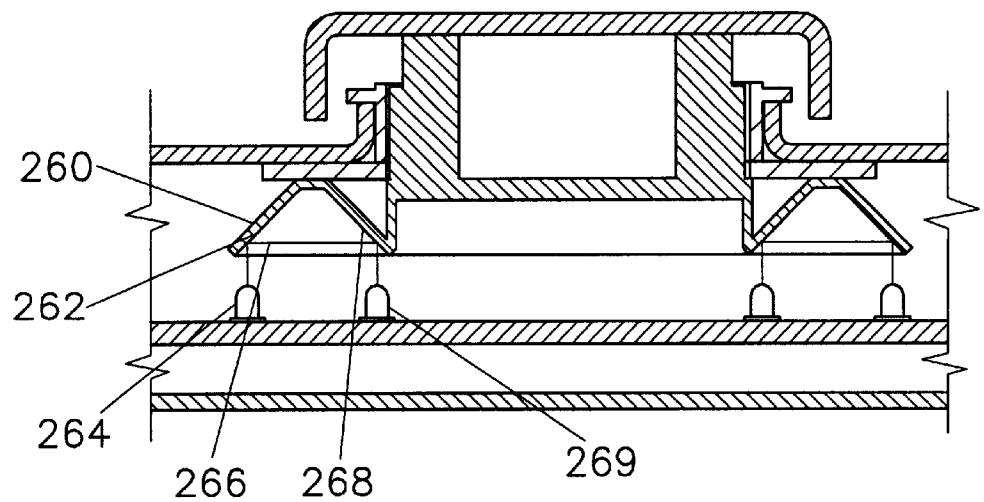
FIG. 26 is an enlarged detail view 140 of FIG. 14 with the circular interrupter in a non-depressed position with an alternative optical design with dual floating mirrors in accordance with the teachings of this invention.

FIG. 26 is an enlarged detail view of FIG. 14 with the circular interrupter in a non-depressed position showing a light beam 266 being directed from emitter 269 to emitter mirror surface 268 to detector mirror surface 262 to detector 264. In this alternate design as mirror circular interrupter 260 is moved in a downward direction the center of beam 266 is directed away from the center of detector 264 thus attenuating the amount of light to detector 264.

Figure 27:
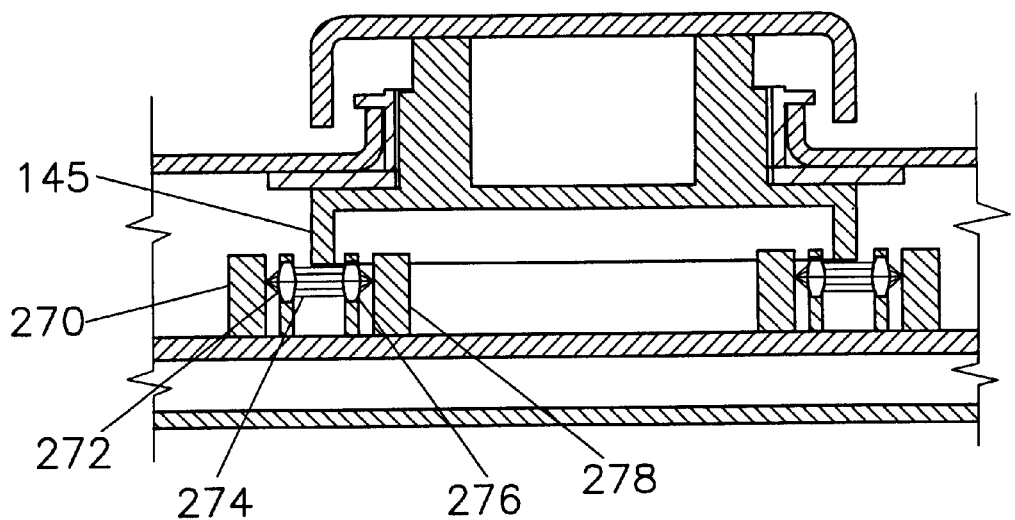
FIG. 27 is an enlarged detail view 140 of FIG. 14 with the circular interrupter in a non-depressed position with an alternative optical design with lenses for collimation in accordance with the teachings of this invention.

FIG. 27 is an enlarged detail view of FIG. 14 with the circular interrupter in a non-depressed position having two lenses to first diverge and then collimate the light beam, thus allowing the circular interrupter 145 a more linear attenuation of light beam 274. Emitter 278 divergent light beam is collimated by emitter lens 276, which is then converged through detector lens 272 to detector 270.

Figure 28:
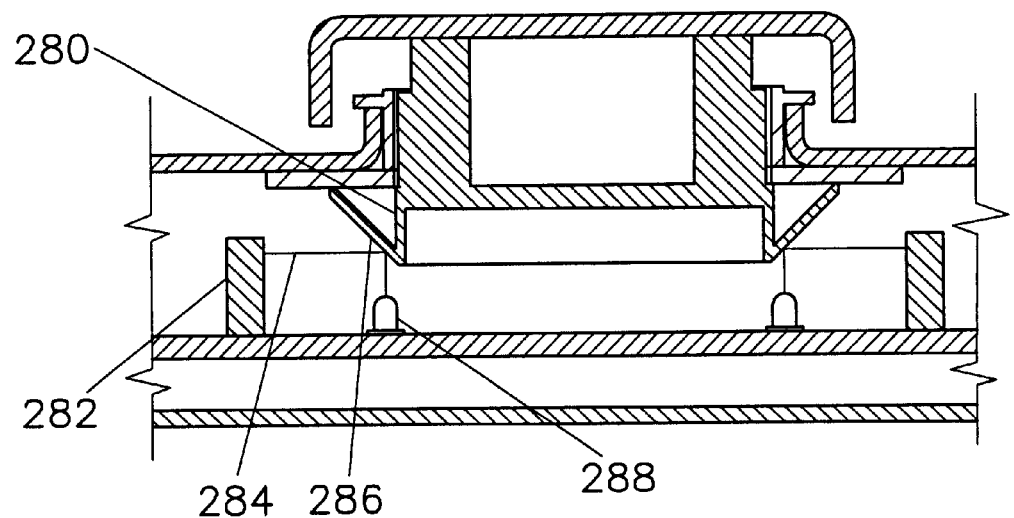
FIG. 28 is an enlarged detail view 140 of FIG. 14 with the circular interrupter in a non-depressed position with an alternative optical design with single floating mirrors in accordance with the teachings of this invention.

FIG. 28 is an enlarged detail view of FIG. 14 with the circular interrupter in a non-depressed position showing a light beam 284 being directed from emitter 288 to emitter mirror surface 286 to detector 282. In this alternate design as mirror circular interrupter 280 is moved in a downward direction the center of beam 284 scans detector 282 thus attenuating the amount of light to detector 282. Detector 282 in this alternative means can be larger with more detection area, be an array with multiple discrete detectors, or a charge surface type detector. This larger detection area allows the distance of circular interrupter 280 ratio to cursor movement to be more linear.

Figure 29:
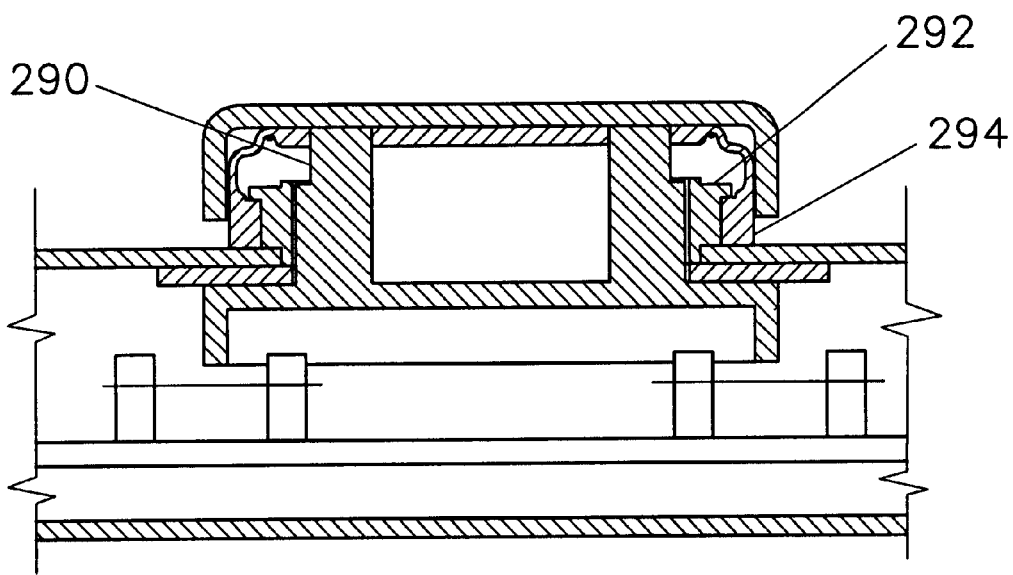
FIG. 29 is an enlarged detail view 140 of FIG. 14 with the circular interrupter in a non-depressed position with an alternative island structure in accordance with the teachings of this invention.

FIG. 29 is an enlarged detail view 140 of FIG. 14 with the circular interrupter in a non-depressed position with showing an alternative island structure whereby separate island 292 is pressed into top surface 10 retaining lower seal thick part 294 keeping contaminates from the interior of the keyboard.

Figure 30:
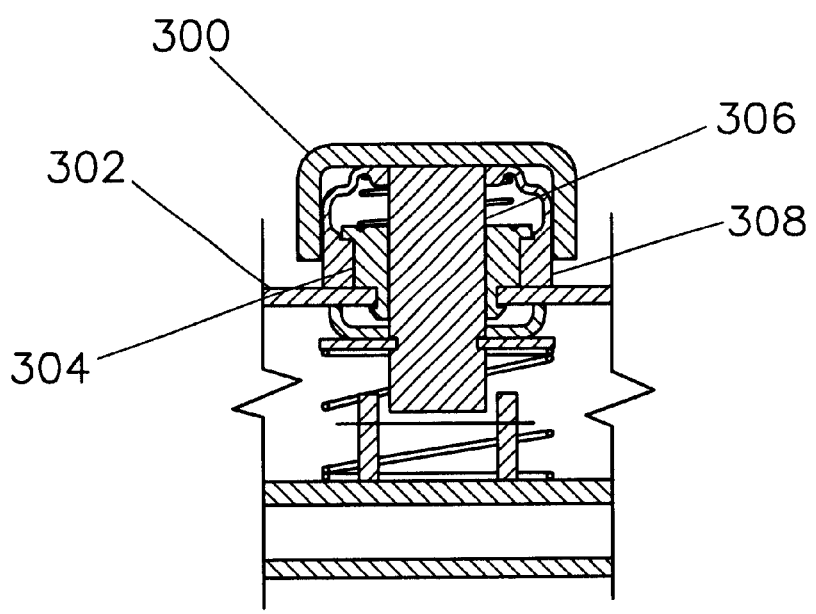
FIG. 30 is a cross section through a typical key structure in a non-depressed position showing an alternative island structure in accordance with the teachings of this invention.

FIG. 30 is a cross section through a typical key structure in a non-depressed position showing an alternative island structure whereby key separate island 304 is pressed into top surface 302 retaining lower seal thick part 308 keeping contaminates from the interior of the keyboard. Key cap 300 is welded to key stem interrupter 306, and is slideably received in key separate island 304.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A keyboard for data entry, comprising in combination:
   a keyboard top surface extending to a plurality of keyboard sides forming a keyboard periphery;
   a plurality of islands rising from and disposed on said keyboard top surface, each of said islands having a base adjacent said keyboard top surface and a top extending upward from said base above said keyboard top surface, each of said islands having an opening in a central region with said top of each of said islands positioned about a periphery of said opening;
   said keyboard top surface being planar or descending from the base of said plurality of islands to at least one, or part thereof, side of said keyboard periphery;
   a plurality of key stems, each key stem being slideably received in said opening of each of said plurality of said islands;
   a plurality of key caps disposed on said key stems;
   a plurality of opposing emitters and detectors disposed about and below said key stems having a light beam there between;
   said key stems having a key stem lower surface;
   a spring means to bias said key stem above said light beam; and
   an electronic circuit to scan said emitters and detectors, and detect when said key stem lower surface has interrupted said light beam, and when said key stem has interrupted said light beam output a code indicating location of at least one of said emitters and detectors interrupted.

2. A keyboard as claimed in claim 1, with a cursor positioning means further including
   an articulator above one of said plurality of islands with a connection means through said one of said plurality of islands to a positioning interrupter below said one of said plurality of islands;
   an inner and outer ring of emitters and detectors disposed around said positioning interrupter;
   said inner and outer ring of emitters and detectors having a light beam there between,
   wherein said interrupter has a first position allowing a first amount of emission from said light beam to contact said detector, and
   wherein said interrupter has a second position allowing a second amount of emission from said light beam to contact said detector;
   an electronic circuit that has stored therein an angular position of each said emitter and detector in said inner and outer ring of emitters and detectors, and
   whereby as said interrupter is moved between said first position toward said second position at least one said emitter of said inner and outer ring of emitters and detectors said emission is varied to at least one said detector equating to the angular direction of cursor movement;
   wherein an amount said interrupter is moved between said first position toward said second position varying said emission of said emitters to said detectors equating to a distance of cursor movement; and
   means to transmit said angular direction and said cursor movement to said computer display.

3. A keyboard as claimed in claim 2, with a cursor positioning means whereby
   said light beam is directed through lenses to collimate said light beam.

4. A keyboard as claimed in claim 2, with a cursor positioning means further including
   at least one mirror placed in said light beam to redirect said light beam.

5. A keyboard as claimed in claim 2, with a cursor positioning means whereby
   a signature equating to angular location of down up movement versus speed of down up movement of said circular interrupter can be interpolated into mouse input switch functions.

6. A keyboard as claimed in claim 1, further including
   a seal disposed around each of said islands, said seal receiving said key stem, and said seal sealing from said island to said key stem.

7. A keyboard as claimed in claim 1, wherein said key step is hollow and further including
   an LED indicator disposed concentric with said key stem for illuminating indicia on said key cap, said LED indicator selectively changing to indicate said key cap and said key stem have been pressed.

8. A keyboard as claimed in claim 1, further including
   removable indicia disposed on at least one of said plurality of said key caps.

9. A keyboard as claimed in claim 1, further including
   a key stem retention means below said keyboard top surface to stop said key stem and said key cap from being removed from above said keyboard top surface.

10. A keyboard as recited in claim 1 wherein each of said key caps includes a downwardly projecting flange for contacting the keyboard top surface and preventing further translation of said key stem through said opening of said island.

11. A keyboard as recited in claim 1 further comprising at least one reflective surface positioned in a path traveled by said light beam.

12. A keyboard for data entry, comprising in combination:

a keyboard top surface extending to a plurality of keyboard edges forming a keyboard periphery;

a plurality of islands rising from and disposed on said keyboard top surface, each of said islands having a base adjacent said keyboard top surface and a top extending upward from said base above said keyboard top surface, each of said islands having an opening in a central region with said top of each of said islands positioned about a periphery of said opening;

said keyboard top surface being planar from the base of said plurality of islands to at least one, or part thereof, edge of said keyboard periphery;

a plurality of key stems, each key stem being slideably received in said opening of each of said plurality of said islands;

a plurality of key caps disposed on said key stems;

a plurality of opposing emitters and detectors disposed about and below said key stems having a light beam there between;

said key stems having a key stem lower surface;

a spring means to bias said key stem above said light beam; and an electronic circuit to scan said emitters and detectors, and detect when said key stem lower surface has interrupted said light beam, and when said key stem has interrupted said light beam output a code indicating location of at least one of said emitters and detectors interrupted.

13. A keyboard as claimed in claim 12, with a cursor positioning means further including an articulator above one of said plurality of islands with a connection means through said one of said plurality of islands to a positioning interrupter below said one of said plurality of islands;

an inner and outer ring of emitters and detectors disposed around said positioning interrupter;

said inner and outer ring of emitters and detectors having a light beam there between, wherein said interrupter has a first position allowing a first amount of emission from said light beam to contact said detector, and wherein said interrupter has a second position allowing a second amount of emission from said light beam to contact said detector;

an electronic circuit that has stored therein an angular position of each said emitter and detector in said inner and outer ring of emitters and detectors, and whereby as said interrupter is moved between said first position toward said second position at least one said emitter of said inner and outer ring of emitters and detectors said emission is varied to at least one said detector equating to the angular direction of cursor movement;

wherein an amount said interrupter is moved between said first position toward said second position varying said emission of said emitters to said detectors equating to a distance of cursor movement; and means to transmit said angular direction and said cursor movement to said computer display.

14. A keyboard as claimed in claim 13, with a cursor positioning means whereby said light beam is directed through lenses to collimate said light beam.

15. A keyboard as claimed in claim 13, with a cursor positioning means further including at least one mirror placed in said light beam to redirect said light beam.

16. A keyboard as claimed in claim 13, with a cursor positioning means whereby a signature equating to angular location of down up movement versus speed of down up movement of said circular interrupter can be interpolated into mouse input switch functions.

17. A keyboard as claimed in claim 12, further including a seal disposed around each of said islands, said seal receiving said key stem, and said seal sealing from said island to said key stem.

18. A keyboard as claimed in claim 12, wherein said key step is hollow and further including an LED indicator disposed concentric with said key stem for illuminating indicia on said key cap, said LED indicator selectively changing to indicate said key cap and said key stem have been pressed.

19. A keyboard as claimed in claim 12, further including removable indicia disposed on at least one of said plurality of said key caps.

20. A keyboard as claimed in claim 12, further including a key stem retention means below said keyboard top surface to stop said key stem and said key cap from being removed from above said keyboard top surface.

21. A keyboard as claimed in claim 12, further including a plurality of downwardly projecting fasteners spaced in from said keyboard edges to secure said keyboard to a mounting surface.

22. A keyboard as recited in claim 12 wherein each of said key caps includes a downwardly projecting flange for contacting the keyboard top surface and preventing further translation of said key stem through said opening of said island.

23. A keyboard as recited in claim 12 further comprising at least one reflective surface positioned in a path traveled by said light beam.

* * * * *